TRANSMIT GAIN CONTROL CIRCUIT

Filed March 27, 1963 2 Sheets-Sheet 1

INVENTORS
ELROY R. MARCUSEN
EUGENE P. SEARL
BY
Moody and Harris
ATTORNEYS

June 28, 1966 E. P. SEARL ETAL 3,258,711

TRANSMIT GAIN CONTROL CIRCUIT

Filed March 27, 1963 2 Sheets-Sheet 2

INVENTORS
ELROY R. MARCUSEN
EUGENE P. SEARL

BY Moody and Harris
ATTORNEYS

United States Patent Office 3,258,711
Patented June 28, 1966

3,258,711
TRANSMIT GAIN CONTROL CIRCUIT
Eugene P. Searl, Marion, Iowa, and Elroy R. Marcusen, Fort Wayne, Ind., assignors to Collins Radio Company, Cedar Rapids, Iowa, a corporation of Iowa
Filed Mar. 27, 1963, Ser. No. 268,238
7 Claims. (Cl. 330—137)

This invention relates to a gain control circuit, and more particularly to a transmit gain control circuit that includes memory means whereby the gain of a controlled device is re-established, after interruption of the input signal, at the same value as that immediately preceding signal interruption.

It is oftentimes desirable that gain control circuits utilized in electronic equipments have highly dependable means providing an ability to remember an established gain setting so that this same gain can be immediately re-established after input signal interruption. This is particularly true for a transmit gain control circuit where the input signal is commonly interrupted for various periods of time.

It is therefore an object of this invention to provide a gain control circuit capable of immediately re-establishing the same gain, after signal interruption, as that preceding the interruption.

More particularly, it is an object of this invention to provide an improved gain control circuit having magnetic memory means for receiving an error signal when the gain of the controlled device varies from a predetermined value and responsive to said error signal causing the gain of the controlled device to be adjusted in a manner so as to reduce said error signal.

It is another object of this invention to provide a highly dependable gain control circuit having no moving parts yet having the ability to immediately re-establish the gain level existing at signal interruption.

With these and other objects in view which will become apparent to one skilled in the art as the description proceeds, this invention resides in the novel construction, combination and arrangement of parts substantially as hereinafter described and more particularly defined by the appended claims, it being understood that such changes in the precise embodiment of the herein disclosed invention may be included as come within the scope of the claims.

Figure 1:
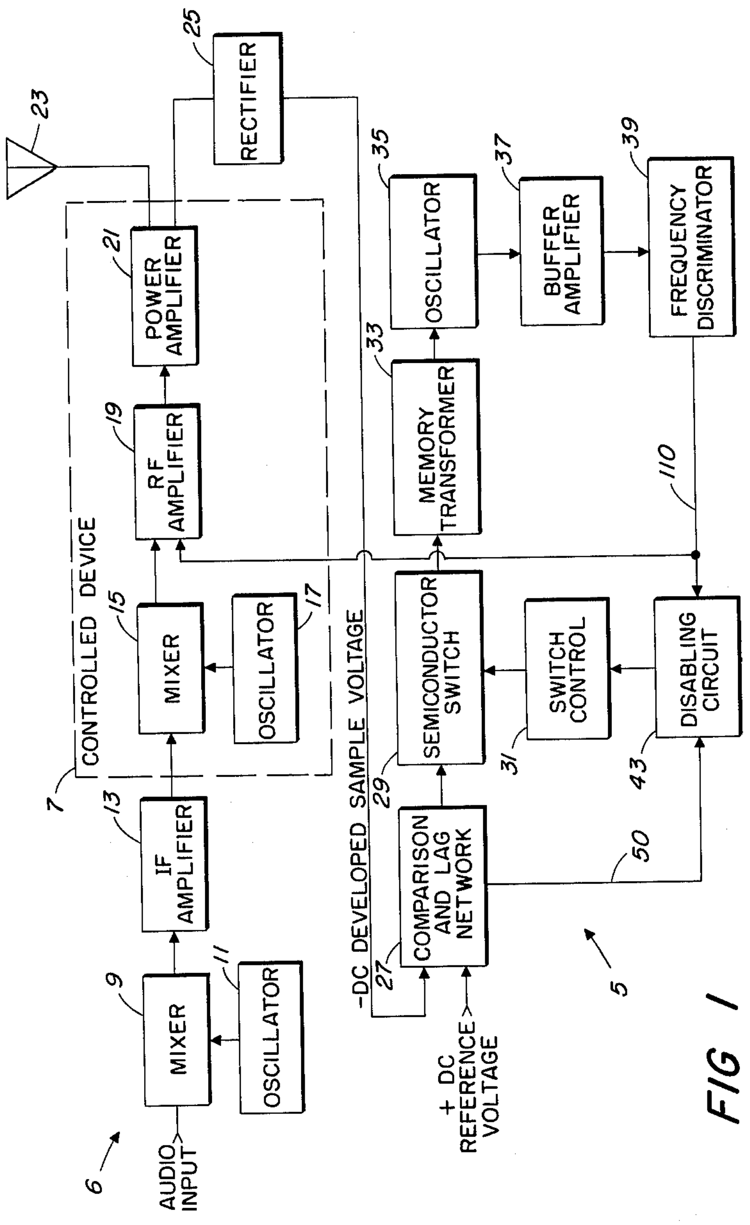
Figure 2:
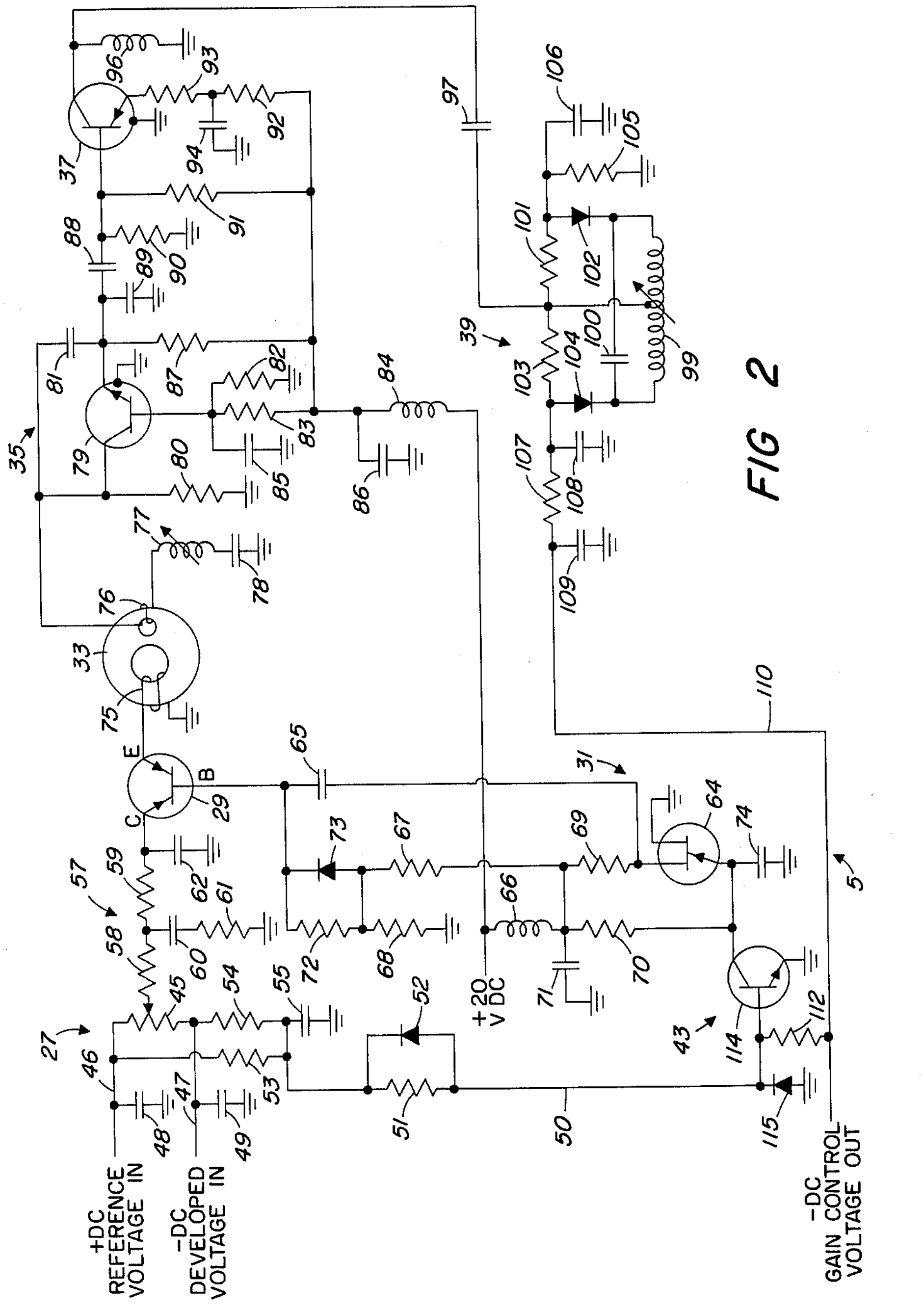

The accompanying drawings illustrate one complete example of the embodiment of the invention constructed according to the best mode so far devised for the practical application of the principles thereof, and in which:

FIGURE 1 is a block diagram of the gain control circuit of this invention as utilized with a transmitter; and FIGURE 2 is a schematic diagram of the gain control circuit per se.

Referring now to the drawings in which like numerals have been used for like characters throughout, the numeral 5 refers generally to the gain control circuit, while the numeral 6 refers generally, in FIGURE 1, to a transmitter that includes a controlled device 7 to be controlled by circuit 5. Controlled device 7 is shown in FIGURE 1 to be the RF section of the transmitter. Such a section, as is conventional, would include one or more amplifying stages the bias of which is commonly controlled by a gain control circuit to maintain constant gain, as is well known in the art.

Transmitter 6 is conventional and, as shown in FIGURE 1 by basic block diagram, includes a mixer 9 for receiving an audio input signal and an IF carrier signal from local oscillator 11. The modulated output signal from mixer 9 is then amplified by IF amplifier 13 and coupled to mixer 15, which mixer also receives a carrier signal from local oscillator 17. The output signal from mixer 15 is then amplified by conventional RF amplifier 19 and power amplifier 21 and transmitted at antenna 23.

The output signal level from controlled device 7 is sensed, as shown in FIGURE 1, by coupling the output signal from power amplifier 21 through conventional rectifier 25 to comparison and lag network 27 of gain control circuit 5.

The D.-C. sample voltage from rectifier 25 is added to a D.-C. reference voltage of opposite polarity in the comparison network and if the developed D.-C. voltage is not balanced out by the reference voltage, an error signal output is produced and coupled to bilateral semiconductor switch 29, periodically rendered conductive for short periods of time by switch control 31. Since semiconductor switch 29 is periodically conductive for only short periods of time, a series of square wave pulses having a polarity dependent upon the polarity of the error signal are produced and these pulses are coupled to memory transformer 33 to determine the flux setting of the magnetic memory multiaperture core thereof. The ferrite core of memory transformer 33 has substantially rectangular hysteresis characteristics and provides nondestructive readout. The characteristics of this type device are known in the art and such a device is described in detail, for example, in an article entitled, "The Transfluxor," by J. A. Rajchman and A. W. Lo, appearing in Proceedings of the IRE, March 1956, volume 44, number 3, pages 321–332.

The flux setting of the core of memory transformer 33 determines the output inductance, which inductance is a part of the frequency determining network of oscillator 35. The output signal from oscillator 35, the frequency of which is therefore controlled by the flux setting of the memory transformer, is coupled through buffer amplifier 37 to frequency discriminator 39. Discriminator 39 produces a negative D.-C. voltage the magnitude of which is dependent upon the output frequency of the oscillator, and this D.-C. voltage is coupled back to the input side of controlled device 7 (as bias) to establish the gain of the controlled device.

The D.-C. output voltage from frequency discriminator 39 is also coupled to disabling circuit 43 where it is combined with an output from comparison and lag network 27. The purpose of this circuit is to cause semiconductor switch 29 to remain in a nonconductive state whenever the combined output from frequency discriminator 39 and comparison and lag network 27 is positive (assuming that the components of the gain control circuit have been selected so that the control voltage from discriminator 39 is of negative polarity for normal operation) so that operation of the memory transformer is maintained on one-half of the hysteresis loop.

As shown in the schematic diagram of FIGURE 2, comparison and lag network 27 includes a potentiometer 45 one end of which is connected to receive the D.-C. reference voltage input through lead 46 and the other end of which is connected to receive the developed D.-C. sample voltage from the controlled device through lead 47. Leads 46 and 47 each have a bypass capacitor, designated by the numerals 48 and 49 to ground. In addition, a lead 50 to disabling circuit 43 is connected through resistor 51 and diode 52 (forming a D.-C. restorer) to the junction of resistors 53 and 54, which resistors are connected in parallel with potentiometer 45. The junction of resistors 53 and 54 is also connected to one end of by-pass capacitor 55, the other end of which is connected to ground.

The variable tap of potentiometer 45 is connected through lag network 57 to the collector of bilateral semiconductor switch 29. As shown in FIGURE 2, serially connected resistors 58 and 59 are connected between the variable tap and the collector of transistor 29, while capacitor 60 and resistor 61 are serially connected between the junction of the resistors and ground and a capacitor 62 is connected between the other side of resistor 59 and ground.

The base of semiconductor switch 29 is connected to switch control 31 which is free-running oscillator. Switch control 31 includes a unijunction transistor 64 one base of which is connected to ground and the other base of which is connected through capacitor 65 to the base of semiconductor switch 29.

A voltage divider connected between a +20-volt D.-C. power supply (not shown) and ground, is provided by inductor 66 and resistors 67 and 68. The ungrounded base of unijunction transistor 64 is connected to the junction of inductor 66 and resistor 67 by means of resistor 69, while the emitter is connected to this junction by means of resistor 70, the junction also having a capacitor 71 to ground. The base of semiconductor switch 29 is connected to the junction of resistors 67 and 68 by means of resistor 72, which resistor is connected in parallel with diode 73 to form a D.-C. restorer.

Switch 29 is bilateral and conducts in either direction when the base receives a negative pulse from switch control 31. An RC network, consisting of resistor 70 and capacitor 74, allows the emitter voltage of unijunction transistor 64 to slowly increase until the firing point is reached. When the firing point is reached, negative spikes are generated on the output line connected to the ungrounded base and coupled to switch 29.

The emitter of semiconductor switch 29 is connected to memory transformer 33 and, more particularly, to the input winding 75 wound about the major aperture thereof. The level of the input pulse determines the set level, which once set is retained, and any intermediate setting is possible. The set level, in turn, controls the inductance of the output winding 76 wound about the minor aperture.

As shown in FIGURE 2, the output winding 76 is connected at one end to ground through variable inductor 77 and capacitor 78 and at the other end to the collector of transistor 79 (of oscillator 35) and it is these components connected to the collector that primarily determine the frequency of oscillator 35. A resistor 80 is also connected between the collector of transistor 79 and ground, while a capacitor 81 is connected between emitter and collector.

The base of transistor 79 is connected to the junction of resistors 82 and 83, the former of which is connected to ground and the latter of which is connected to the +20-volt power supply through inductor 84. In addition, a bypass capacitor 85 is connected between the base of transistor 79 and ground and another capacitor 86 from one side of inductor 84 to ground, while the emitter of transistor 79 is connected to the power supply through inductor 84 and resistor 87.

The emitter of transistor 79 is connected to the base of buffer amplifier 37 through a capacitor 88, one side of which has a capacitor 89 to ground and the other side of which has a resistor 90 to ground. In addition, the base of amplifier 37 is coupled to the +20-volt power supply through inductor 84 and resistor 91, while the emitter is coupled to the power supply through inductor 84 and resistors 92 and 93 connected in series, the junction of resistors 92 and 93 having a capacitor 94 to ground. The collector of buffer amplifier 37 has an inductor 96 to ground and is connected to frequency discriminator 39 through capacitor 97.

Frequency discriminator 39 includes a variable inductor 99 having a capacitor 100 connected in parallel therewith. A resistor 101 and diode 102 connects one end of the inductor with the center tap, while a resistor 103 and diode 104 connects the other end with the center tap, and the input signal from oscillator 37 is coupled to this junction of the center tap and resistors 101 and 103.

As shown in FIGURE 2, the discriminator has a resistor 105 and capacitor 106 connected in parallel from the junction of resistor 101 and diode 102 to ground, and the D.-C. gain control voltage is coupled from the discriminator through resistor 107 connected to the junction of resistor 103 and diode 104, resistor 107 having capacitors 108 and 109 to ground at each side thereof.

The D.-C. output signal from the frequency discriminator is coupled back to the input side of the device to be controlled, as indicated in FIGURE 1, by means of lead 110. This D.-C. voltage could be used to bias the amplifier in the RF section of the transmitter, for example, when used as a transmit gain control.

The D.-C. output signal from discriminator 39 is also coupled through resistor 112 to disabling circuit 43 where it is combined with the output from comparison and lag network 27 at the base of transistor 114. The emitter of transistor 114 is grounded, while a diode 115 is connected between the base and ground, and the collector is connected to the emitter of unijunction transistor 64. Transistor 114 is nonconductive so long as the base remains negative.

In operation, no error signal output is produced by comparison and lag network 27 so long as the sampled D.-C. voltage is of the proper polarity and magnitude to balance out the reference voltage in the comparison network. With no error signal, of course, the frequency of oscillator 35 will remain unchanged so that the D.-C. gain control voltage (from discriminator 39) will remain unchanged to hold the gain of the controlled device constant.

If the output level of the controlled device varies, the sampled D.-C. voltage will change and an error signal will be developed by the comparison and lag network, the polarity of the signal depending upon whether the sampled D.-C. voltage increased or decreased. Assuming, for example, that the amplifier output level increased, the sampled D.-C. voltage will also be increased and will result in a negative error voltage, which voltage charges capacitor 62.

When semiconductor switch 29 is rendered conductive by switch control 31, which is done periodically at a rate typically of seven pulses per second, capacitor 62 discharges through the switch and the input winding 75 of memory transformer 33. The repeated discharging of the capacitor causes a series of square wave pulses to be coupled through winding 75 of the memory transformers (the switch, being bilaterally conductive, allows pulses of either polarity to be coupled to winding 75).

Again assuming the error signal is negative, the negative pulses will adjust the flux level of the multiaperture core so that the output frequency of oscillator 35 is increased. This increase in frequency then results in a higher negative D.-C. output voltage from discriminator 39, which D.-C. voltage is fed back to the input side of the controlled device to lower the amplifier gain and therefore reduce the output level and ultimately eliminate the error signal.

If the error signal had been positive, the output frequency of the oscillator would have been reduced and the gain of the controlled device thereby increased in the same manner.

To assure that the memory transformer will be operated only on one-half of the hysteresis loop to avoid operation in a false mode, the output of the discriminator is combined with an output from the comparison network at the base of transistor 114 of disabling circuit 43. If this combined signal is positive, the emitter of unijunction transistor 64 of switch control 31 is grounded to prevent semiconductor switch 31 from being rendered conductive. When the combined signal to disabling circuit 43 again becomes negative, normal operation resumes.

Utilizing this invention as a transmit gain control circuit, the controlled amplifier can be held within about ±1 decibel of the present level with a 20-decibel change in input signal.

Particular components utilized in a working embodiment of the gain control circuit of this invention are as follows:

| Numeral | Component | Designation or Value |
|---|---|---|
| 29 | Bilaterally conductive transistor | 2N1319. |
| 37 | Transistor | 2N1285. |
| 45 | Potentiometer | 100K ohms. |
| 48 | Capacitor | 0.02 microfarads. |
| 49 | do | 0.02 microfarads. |
| 51 | Resistor | 1 megohm. |
| 52 | Diode | 1N627. |
| 53 | Resistor | 178K ohms. |
| 54 | do | 287K ohms. |
| 55 | Capacitor | 10 microfarads. |
| 58 | Resistor | 1,800 ohms. |
| 59 | do | 4,700 ohms. |
| 60 | Capacitor | 140 microfarads. |
| 61 | Resistor | 1,800 ohms. |
| 62 | Capacitor | 10 microfarads. |
| 64 | Unijunction transistor | 2N491. |
| 65 | Capacitor | 0.68 microfarads. |
| 66 | Inductor | 180 millihenries. |
| 67 | Resistor | 100K ohms. |
| 68 | do | 10K ohms. |
| 69 | do | 1,200 ohms. |
| 70 | do | 390K ohms. |
| 71 | Capacitor | 50 microfarads. |
| 72 | Resistor | 18 megohms. |
| 73 | Diode | 1N627. |
| 74 | Capacitor | 1 microfarad. |
| 77 | Inductor | Variable. |
| 78 | Capacitor | 525 picofarads. |
| 79 | Transistor | 2N1285. |
| 80 | Resistor | 1,000 ohms. |
| 81 | Capacitor | 5,000 picofarads. |
| 82 | Resistor | 15K ohms. |
| 83 | do | 3,900 ohms. |
| 84 | Inductor | 22 millihenries. |
| 85 | Capacitor | 0.1 microfarads. |
| 86 | do | 0.1 microfarads. |
| 87 | Resistor | 1,500 ohms. |
| 88 | Capacitor | 2,200 picofarads. |
| 89 | do | 5,000 picofarads. |
| 90 | Resistor | 5,600 ohms. |
| 91 | do | 3,900 ohms. |
| 92 | do | 1,500 ohms. |
| 93 | do | 100 ohms. |
| 94 | Capacitor | 0.1 microfarads. |
| 96 | Inductor | 10 millihenries. |
| 97 | Capacitor | 0.1 microfarads. |
| 99 | Inductor | 0.5 millihenries. |
| 100 | Capacitor | 130 picofarads. |
| 101 | Resistor | 47K ohms. |
| 102 | Diode | 1N270. |
| 103 | Resistor | 47K ohms. |
| 104 | Diode | 1N270. |
| 105 | Resistor | 18K ohms. |
| 106 | Capacitor | 0.02 microfarads. |
| 107 | Resistor | 68K ohms. |
| 108 | Capacitor | 0.02 microfarads. |
| 109 | do | 0.47 microfarads. |
| 112 | Resistor | 2.2 megohms. |
| 114 | Transistor | 2N1973. |
| 115 | Diode | 1N627. |

It is to be realized, however, that this invention is not meant to be limited to the particular component values set forth hereinabove.

From the foregoing, it should be appreciated that this invention provides a novel gain control circuit that has no moving parts yet has the ability to immediately re-establish, after signal interruption, the same gain in a controlled device at that which existed immediately preceding said interruption.

What is claimed as our invention is:

1. A circuit for controlling the gain of amplifier means, comprising: first means for receiving the output signal from said amplifier means and developing an error signal whenever the magnitude of the output signal varies from a predetermined level; a magnetic memory core having substantially rectangular hysteresis characteristics, said core having wound thereon an input winding and an output winding; means connected between said first means and said input winding for causing the flux setting of said core to be varied due to said error signal; an oscillator having a frequency determining network that includes the output winding of said magnetic memory core; a frequency discriminator for receiving the output signal from said oscillator and responsive thereto developing a gain control output signal; and means for coupling said gain control signal to said amplifier means to establish the gain thereof.

2. The circuit of claim 1 wherein said first means includes means for rectifying the output signal from said amplifier means and comparison means for comparing the resulting D.C. voltage with a D.C. reference voltage of opposite polarity.

3. A circuit for controlling the gain of amplifier means, comprising first means for receiving the output signal from said amplifier means and developing an error signal whenever the magnitude of the output signal varies from a predetermined level; a magnetic memory core having substantially rectangular hysteresis characteristics, said core having wound thereon an input winding and an output winding; means including switch means connected between said first means and said input winding; an oscillator having a frequency determining network that includes the output winding of said magnetic memory core, the inductance of said output winding being determined by the flux setting of said core; switch control means to control closing of said switch means periodically whereby the flux setting of said core is varied due to said error signal; a frequency discriminator for receiving the output signal from said oscillator and responsive thereto developing a gain control output signal; and means for coupling said gain control signal to said amplifier means to establish the gain thereof.

4. The circuit of claim 3 further characterized by a disabling circuit connected between said first means and said switch control means for maintaining operation of said magnetic memory core on only one-half of the hysteresis loop.

5. An amplifier gain control circuit, comprising: a memory core having substantially rectangular hysteresis characteristics and having wound thereon an input winding and an output winding, the inductance of said output winding being determined by the flux setting of said memory core; an oscillator having a frequency determining means that includes said output winding; a frequency discriminator for receiving the output from said oscillator and responsive thereto developing a gain determining signal; means for coupling said gain determining signal to the amplifier to be controlled to establish the gain thereof; means for sampling the output from said amplifier to be controlled and in response thereto developing an error signal if the output signal from said amplifier varies from a predetermined level; and means for receiving said error signal and causing the flux setting of said memory core to be varied in a manner so as to eliminate said error signal.

6. A gain control circuit, comprising: means for sampling the output signal of a device to be controlled and developing therefrom a D.C. voltage indicative of the level of said signal; comparison means connected to receive said developed D.C. voltage and a reference D.C. voltage and producing an error signal if said developed D.C. voltage varies from a predetermined value; capacitor means connected to said comparison means, said capacitor means being charged by said error signal; a bilateral semiconductor switch connected to said capacitor means; switch control means for periodically rendering said semiconductor switch conductive to allow said capacitor means to discharge therethrough; a multiaperture core having an input means to discharge therethrough; a multiaperture core having an input winding wound about its major aperture and an output winding wound about a minor aperture, said input winding being connected to said semiconductor switch; an oscillator having a frequency determining network that includes the output winding of said multiaperture core; a frequency discriminator connected to receive the output signal from said oscillator; and means for coupling the output from said discriminator to said device to be controlled to establish the gain thereof.

7. The circuit of claim 6 further characterized by a disabling circuit connected to receive the output from said comparison means and the output from said frequency discriminator and responsive thereto causing said semiconductor switch to remain nonconductive if the combined signal is of the opposite polarity with respect to the polarity of the output signal is of the opposite polarity with respect to the polarity of the output signal from said frequency discriminator.

No references cited.

ROY LAKE, *Primary Examiner.*

N. KAUFMAN, *Assistant Examiner.*